United States Patent
Wolff et al.

(10) Patent No.: US 10,289,779 B2
(45) Date of Patent: May 14, 2019

(54) UNIVERSAL VERIFICATION METHODOLOGY (UVM) REGISTER ABSTRACTION LAYER (RAL) TRAFFIC PREDICTOR

(71) Applicant: Raytheon Company, Waltham, MA (US)

(72) Inventors: Luke Wolff, Owens Cross Roads, AL (US); Neel Shah, Marana, AZ (US)

(73) Assignee: Raytheon Company, Waltham, MA (US)

( * ) Notice: Subject to any disclaimer, the term of this patent is extended or adjusted under 35 U.S.C. 154(b) by 27 days.

(21) Appl. No.: 15/490,208

(22) Filed: Apr. 18, 2017

(65) Prior Publication Data

US 2018/0300431 A1    Oct. 18, 2018

(51) Int. Cl.
*G06F 13/42*  (2006.01)
*G06F 17/50*  (2006.01)

(52) U.S. Cl.
CPC ............ *G06F 17/504* (2013.01); *G06F 13/42* (2013.01); *G06F 17/5027* (2013.01)

(58) Field of Classification Search
USPC ........................................................ 716/106
See application file for complete search history.

(56) References Cited

U.S. PATENT DOCUMENTS

| | | | |
|---|---|---|---|
| 6,499,123 B1 | 12/2002 | McFarland et al. | |
| 6,792,563 B1 | 9/2004 | DesRosier et al. | |
| 7,561,999 B2 | 7/2009 | Iwamoto et al. | |
| 8,413,088 B1 | 4/2013 | Armbruster et al. | |
| 8,578,309 B2 | 11/2013 | Mehta et al. | |
| 8,972,914 B2 | 3/2015 | Ardeishar et al. | |
| 2002/0040288 A1 | 4/2002 | Yamoto et al. | |
| 2003/0225561 A1* | 12/2003 | Garcia | G06F 17/5022 703/17 |
| 2004/0268200 A1* | 12/2004 | Mak | G01R 31/31707 714/742 |
| 2009/0150137 A1 | 6/2009 | Kumazaki | |

(Continued)

OTHER PUBLICATIONS

Bergeron, et al.; "VMM Primer Using the Register Abstraction Layer"; Version 1.4; Mar. 27, 2008; 22 Pages.

(Continued)

*Primary Examiner* — Mohammed Alam
(74) *Attorney, Agent, or Firm* — Daly Crowley Mofford & Durkee LLP

(57) ABSTRACT

A system for verifying functionality of a circuit design under test (DUT) includes a control station comprising at least one graphical user interface (GUI); and at least one emulator in communication with the control station. The emulator may include a verification component and a register abstraction layer (RAL), wherein the verification component is configured to implement the DUT and the RAL is configured to implement one or more communication interfaces of the DUT. A traffic predictor in communication with the at least one emulator may monitor data traffic over the communication interface between the at least one emulator and the DUT, predict a response to the data traffic by the DUT, monitor a response to the traffic by the DUT, and determine if the response by the DUT matches the predicted response.

17 Claims, 5 Drawing Sheets

(56) References Cited

U.S. PATENT DOCUMENTS

| | | | |
|---|---|---|---|
| 2010/0082315 A1* | 4/2010 | Hall | G06F 11/261 |
| | | | 703/13 |
| 2011/0238397 A1 | 9/2011 | Chen et al. | |
| 2015/0261903 A1 | 9/2015 | Jose | |
| 2015/0310159 A1 | 10/2015 | Raghavan et al. | |
| 2018/0060453 A1* | 3/2018 | Shah | G06F 17/5009 |

OTHER PUBLICATIONS

Halecek; "Design of a verification environment for a smart sensor"; Master's thesis; Czech Technical University in Prague; Faculty of Information Technology; Department of Digital Design; Apr. 29, 2015; 61 Pages.

Salah; "A UVM-Based Smart Functional Verification Platform: Concepts, Pros, Cons, and Opportunities"; $9^{th}$ International Design and Test Symposium; 2014; 6 Pages.

Van der Schoot, et al.; "UVM and Emulation: How to Get Your Ultimate Testbench Acceleration Speed-up"; Design and Verification Conference and Exhibition Europe; 2015; 16 Pages.

PCT Search Report & Written Opinion of the ISA dated Jul. 25, 2017 from International Application No. PCT/US2017/025829; 20 Pages.

U.S. Appl. No. 15/245,404, filed Aug. 24, 2016, Shah.

"Universal Verification Methodology (UVM) 1.1 User's Guide" by Accellera; May 18, 2011; 198 pages.

"Universal Verification Methodology (UVM) 1.1 Class Reference" by Accellera; Jun. 2011; 852 pages.

"The UVM Register Layer Introduction and Experiences" by Steve Holloway, Dialog Semiconductor; Nov. 19, 2012; 16 pages.

"Verification and Automation Improvement Using IP-XACT"; Accellera Systems Initiative; Design and Verification Conference & Exhibition; Feb. 27, 2012; 28 pages.

Non-Final Office Action dated Aug. 9, 2018 for U.S. Appl. No. 15/245,404; 22 Pages.

Response to U.S. Non-Final Office Action dated Aug. 9, 2018 for U.S. Appl. No. 15/245,404; Response filed Oct. 25, 2018; 13 Pages.

U.S. Final Office Action dated Feb. 25, 2019 for U.S. Appl. No. 15/245,404; 26 pages.

\* cited by examiner

UNIVERSAL VERIFICATION METHODOLOGY (UVM) REGISTER ABSTRACTION LAYER (RAL) TRAFFIC PREDICTOR

BACKGROUND

Due to the high costs associated with developing an integrated circuit (IC), first-pass success in IC fabrication can be critical to business success and profit margins. Therefore, it can be beneficial for engineers to verify the functionality of an IC design before semiconductor fabrication or manufacturing. For example, many ICs may include complex circuit components, signal routings and logic blocks that should be debugged or verified to function substantially as expected prior to fabrication of the IC. Functional verification of the IC design may include verifying that the design conforms to certain specification parameters as well as certain functional parameters. Functional verification may include generating Register Transfer Level (RTL) representations of various circuit elements of the IC design that represent the functionality of the circuit element for several clock cycles of operation of the IC. Generating and verifying the RTL representations can be a difficult and time consuming task.

Further, many modern ICs may include multiple communication interfaces (e.g., Ethernet, Universal Serial Bus (USB), Peripheral Component Interconnect Express (PCIe), or other interfaces that are not easily decoded from viewing a signal timing waveform. Thus, it can be difficult to verify that correct stimulus signals have been received (e.g., via the communication interfaces) by a design under test (DUT) and that correct responses signals have been sent from the DUT (e.g., via the communication interfaces).

SUMMARY

In an embodiment, a system for verifying functionality of a circuit design under test (DUT) includes a control station comprising at least one graphical user interface (GUI); and at least one emulator in communication with the control station, the emulator comprising a verification component and a register abstraction layer (RAL), wherein the verification component is configured to implement the DUT and wherein the RAL is configured to implement one or more communication interfaces of the DUT The at least one emulator may be configured to generate stimulus for a communication interface of the DUT, the stimulus comprising one or more transactions, the transactions associated with commands of the communication interface and test data associated with the commands. The emulator may send the stimulus to the DUT via the communication interface and monitor one or more associated responses sent from the DUT via the communication interface. A traffic predictor in communication with the at least one emulator and the control station may monitor data traffic over the communication interface between the at least one emulator and the DUT; predict a response to the data traffic by the DUT; monitor a response to the traffic by the DUT; and determine if the response by the DUT matches the predicted response.

One or more of the following features may be included.

The emulator may be further configured to generate one or more protocol-specific sequence items for each transaction, protocol-specific sequence items specific to a protocol of the communication interface; and convert the one or more protocol-specific sequence items into one or more associated protocol-agnostic register abstraction layer (RAL) uvm_reg_items.

The emulator may be further configured to generate, based upon the stimulus, one or more protocol-specific response sequence items; and convert the one or more protocol-specific response sequence items into one or more associated protocol-agnostic register abstraction layer (RAL) uvm_reg_items.

The traffic predictor may be configured to decode the protocol-agnostic RAL uvm_reg_items into source commands and test data.

The traffic predictor may be configured to count a first number of responses by the DUT that match the predicted responses and a second number of responses by the DUT that do not match the predicted responses.

The traffic predictor may be configured to display the first number as a number of tests passed and the second number as a number of tests failed.

The traffic predictor may determine whether a response by the DUT matches the predicted response by monitoring a register and/or by monitoring data traffic generated by the DUT.

The traffic predictor may be further configured to determine if the data traffic includes a route-through message to be routed through the DUT.

The traffic predictor may be configured to determine if the response by the DUT includes the route-through message.

The traffic predictor may be configured to determine if the response by the DUT includes messages initiated exclusively by the DUT.

In another embodiment, a computer-implemented method for verifying functionality of a circuit design under test (DUT) includes generating a stimulus for a communication interface of the DUT, the stimulus comprising one or more transactions, the transactions associated with commands of the communication interface and test data associated with the commands. The stimulus is sent to the DUT via the communication interface and monitoring one or more associated responses sent from the DUT via the communication interface. A response by the DUT to the one or more transactions is predicted. The response by the DUT to the one or more transactions is monitored. Whether the response by the DUT matches the predicted response is determined.

One or more of the following features may be included.

Generating the stimulus may include generating one or more protocol-specific sequence items for each transaction, protocol-specific sequence items specific to a protocol of the communication interface; and converting the one or more protocol-specific sequence items into one or more associated protocol-agnostic register abstraction layer (RAL) uvm_reg_items.

Monitoring the one or more associated responses may include generating, based upon the stimulus, one or more protocol-specific response sequence items; and converting the one or more protocol-specific response sequence items into one or more associated protocol-agnostic register abstraction layer (RAL) uvm_reg_items.

The protocol-agnostic RAL uvm_reg_items may be decoded into source commands and test data.

A first number of responses by the DUT that match the predicted responses and a second number of responses by the DUT that do not match the predicted responses may be counted.

The first number may be displayed as a number of tests passed and the second number may be displayed as a number of tests failed.

The predicted response may be matched by monitoring a register and/or by monitoring data traffic generated by the DUT and comparing the register and/or data traffic to the predicted response.

Whether the response by the DUT includes the route-through message may be determined.

The traffic predictor may be configured to determine if the response by the DUT includes messages initiated exclusively by the DUT.

In another embodiment, a system for verifying functionality of a circuit design under test (DUT) includes a control station comprising at least one graphical user interface (GUI); a first UVM verification component (UVC) in communication with the control station and the DUT, wherein the first UVC is configured to communicate with the DUT over a first communication interface of the DUT; and a second UVC in communication with the control station and the DUT. The he second UVC may be configured to communicate with the DUT over a second communication interface of the DUT. A traffic predictor in communication with the first and second UVCs may be included. The traffic predictor may be configured to: monitor input data traffic to the DUT over the first communication interface; monitor output traffic from the DUT over the first and/or second communication interface; compare the output traffic from the DUT to a predicted output of the DUT in response to the data traffic to the DUT; and determine if the output of the DUT matches the predicted output.

One or more of the following features may be included.

The traffic predictor may be further configured to count a test pass if the output of the DUT matches the predicted output and count a test fail if the output of the DUT does not match the predicted output.

A GUI may be configured to display a count of the test passes and a count of the test fails.

BRIEF DESCRIPTION OF THE DRAWINGS

Other aspects, features, and advantages of the described embodiments will become more fully apparent from the following detailed description, the appended claims, and the accompanying drawings in which like reference numerals identify similar or identical elements. Reference numerals that are introduced in the specification in association with a drawing figure might be repeated in one or more subsequent figures without additional description in the specification in order to provide context for other features.

DETAILED DESCRIPTION

Figure 1:
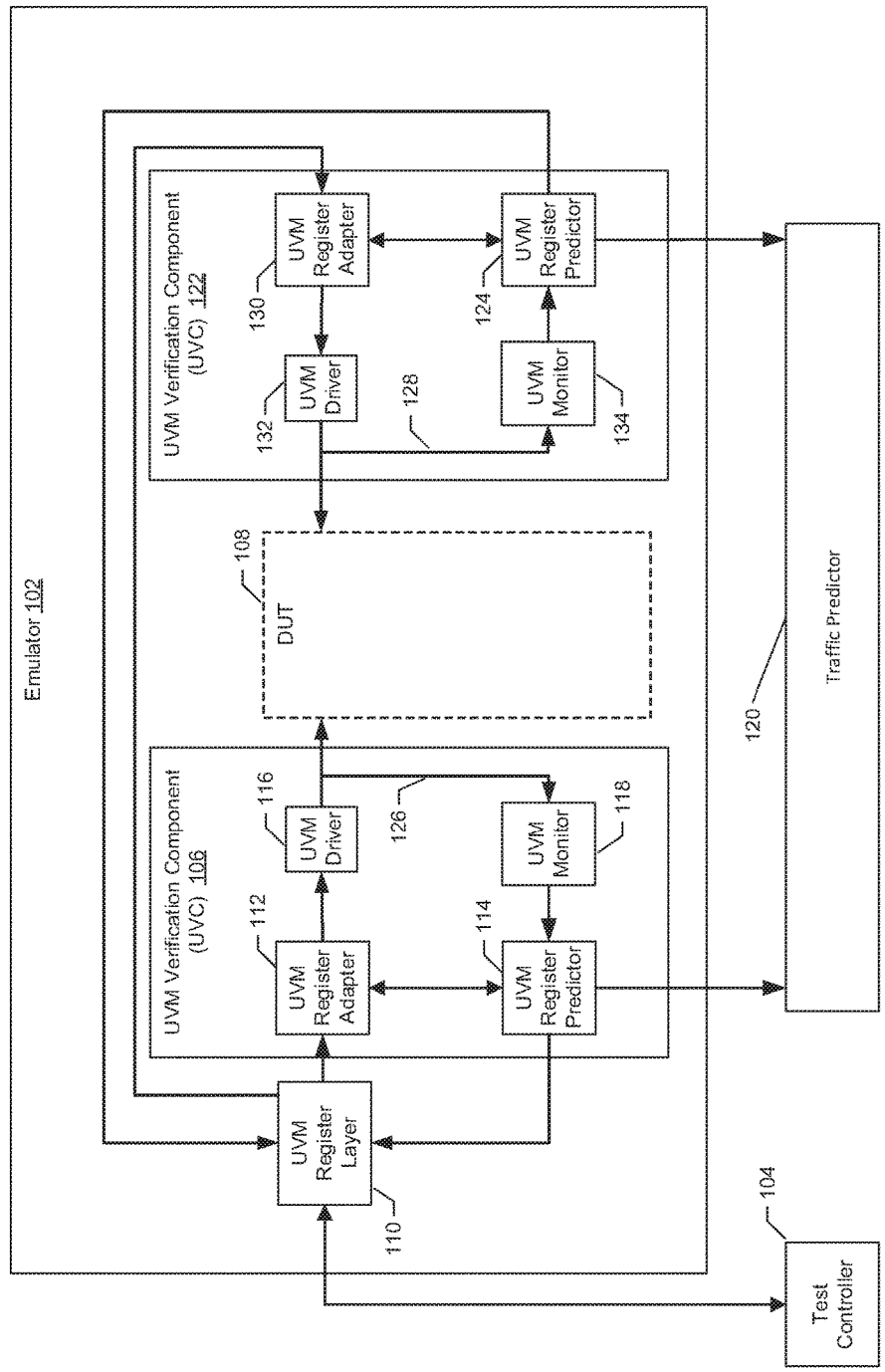
FIG. 1 is a block diagram of an illustrative system to verify an integrated circuit (IC) design in accordance with described embodiments.

Referring to FIG. 1, a block diagram of illustrative integrated circuit (IC) verification system is shown as "tes-tbench" 100. In some embodiments, testbench 100 may be implemented as a Universal Verification Methodology (UVM) testbench. A UVM testbench may provide automatic test generation, self-checking tests, and coverage metrics to verify an IC design under test (DUT), shown as DUT 108. A DUT may be verified by setting verification goals and testbench parameters to generate test stimuli (e.g., either directed or constrained-random stimuli) that are applied to the DUT via one or more UVM drivers 116, 132. One or more monitors 118, 134 may identify behavior of DUT 108 in response to the test stimuli to verify the DUT. UVM is described in greater detail in the Universal Verification Methodology (UVM) 1.1 User's Guide, published May 18, 2011 by Accellera Systems Initiative of Elk Grove, Calif., USA, which is incorporated here by reference in its entirety. A similar testbench may be described in U.S. patent application Ser. No. 15/245,404 (filed Aug. 24, 2016), which is incorporated here by reference in its entirety.

As shown in FIG. 1, illustrative testbench 100 may include emulator 102 to implement a design under test as DUT 108. Emulator 102 may also include UVM verification component (UVC) 106 and/or UVC 122 in communication with DUT 108. For example, emulator 102 may use a hardware verification language (HVL) to implement DUT 108 for an application specific integrated circuit (ASIC), field programmable gate array (FPGA), or system on chip (SoC).

Data may be applied to the DUT from UVM register layer 110 and/or directly to the UVC 106 and/or UVC 122 using a uvm_sequencer function or class (not shown), for example. For example, UVM register layers 110 may contain an application program interface (API) that allow standard creation of networking packets, bus transactions, and instructions to be employed to verify DUT 108. The UVM register layer 110 API may provide a protocol-agnostic format (e.g., a general format that can be converted for use with specific protocols using a UVM Register Adapter 112 and/or UVM Register Adapter 130). In a typical test, many data items may be generated and sent to the DUT, for example to test certain conditions or in a random order. Test controller 104 may allow a user to change configuration properties of the UVM testbench 100 and UVC 106 and/or UVC 122 to make changes to tests and test data during testing and verification of the design. In some embodiments, test controller 104 may be a computing device such as described regarding FIG. 5.

In embodiments, UVC 122 may be coupled to one interface of DUT 108 and UVC 106 may be coupled to another interface of DUT 108. For example, UVC 122 may be coupled to an Ethernet interface and UVC 106 may be coupled to a Universal Serial Bus (USB) interface. The UVCs may be coupled to any other type of interface including, but not limited to: PCIe, PCI, SATA, DDR memory, Flash memory, or any other type of communication interface.

UVM register adapter 112 converts the protocol-agnostic packets, transactions and instructions stored in UVM register layer 110 into protocol-specific packets, transactions and instructions associated with a specific UVM driver 116. Similarly, UVM register adapter 130 converts the protocol-agnostic packets, transactions and instructions stored in UVM register layer 110 into protocol-specific packets, transactions and instructions associated with a specific UVM driver 132. For example, the Ethernet protocol may define valid values and attributes for an Ethernet data packet based upon the protocol-agnostic API provided in the UVM register layer 110.

The UVM Register Adapter 112 may convert the standard instruction received from the API of UVM Register Layer 110 into protocol specific instruction for UVC 106. UVC 106 may utilize a sequencer (e.g. a uvc_sequencer; not shown) that receives the protocol specific instruction orders to be provided to UVM driver 116. Similarly, the UVM Register Adapter 130 may convert the standard instruction received from the UVM Register Layer 110's API into UVC 122's protocol specific instruction. Any or all UVCs may utilize a sequencer (e.g. a uvc_sequencer; not shown) that receives protocol specific instruction orders to be provided to UVM driver. For simplicity, an arrow shows the UVM Register Adapters 112 and 130 directly communicating with UVM drivers 116 and 132, respectively. Ordering the instructions may provide a random or structured sequence of stimulus data to verify DUT 108. The sequencer may also generate response data based upon response signals from DUT 108 sampled by UVM monitors 118 and 134.

A UVM driver may be employed to emulate specific portions of logic that operate the DUT. For example, a UVM driver may be associated with a specific communications interface bus, for example Ethernet, Universal Serial Bus (USB), Peripheral Component Interconnect Express (PCIe), or other interfaces. A given UVM driver 116 (or 132) may repeatedly receive data from UVM register adapter 112 (or 130) and drive stimulus signals to DUT 108. For example, UVM driver 116 may control read/write signals, address buses, and data buses for a number of clock cycles to perform data transfers for the associated communications interface bus. UVM monitor 118 (or 134) may sample the stimulus signals applied to DUT 108 and sample the response signals from DUT 108. UVM monitor 118 (134) may collect coverage information and perform checking. For example, UVM monitor 118 (134) may extract signal information from a bus and plot output waveforms.

UVM Register Predictor 114 (or 124) may convert the protocol-specific packets, transactions, and instructions associated with a specific UVM driver 116 (or 132) that are sampled by UVM monitor 118 (or 134) into a protocol-agnostic transaction which is published to the traffic predictor 120. The protocol-agnostic transaction may be stored in an uvm_reg_item class, which may represent a register item and may be provided by the UVM Methodology. The uvm_reg_item class indicates which UVC observed the transaction, address, data, and the access type (Read or Write). In addition, UVM Register Predictor 114 (or 124) may update UVM register layer 110's memory model associated with the prediction.

Some designs may include one or more complex communication interface buses, for example Ethernet, Universal Serial Bus (USB), Peripheral Component Interconnect Express (PCIe), or other interfaces. Such complex bus protocols may generally be difficult to decode from signal waveform timing diagrams. Thus, in conventional systems, verifying that the correct response has occurred for an applied stimulus can be difficult and time consuming (e.g., to decode signal timing diagrams to verify the DUT).

Traffic predictor 120 may provide fully decoded bus accesses (e.g., read and/or write signals and data) for any protocol employed by DUT 108. Traffic predictor 120 may be in communication with UVC 106, UVC 122, and or any other UVC that is coupled to a communication interface of DUT 108. As an example, UVC 106 may send a message to DUT 108 over bus 126. Traffic predictor 120 may monitor and examine the uvm_reg_item class provided by UVM Register Predictor 124.

Based on the decoded uvm_reg_item class, Traffic Predictor 120 may predict output on one (or more) of DUT 108's communication interfaces. Traffic Predictor 120 examines all received uvm_reg_items with a Write access. Traffic Predictor 120 may then determine if the uvm_reg_item decoded address is external to DUT 108. If the decoded address is an address external to DUT 108, then DUT 108 may pass the message through to another one of DUT 108's communication interfaces, with or without changes to the message data. Traffic predictor 120 may predict the output message and monitor the output bus. If traffic predictor 120 sees the expected output message on the expected output bus, traffic predictor 120 scoring may indicate a test pass. If traffic predictor 120 does not see the expected output message on the expected output bus, traffic predictor 120 scoring may indicate a test fail. For example, a failed test may occur if the expected message does not appear on the output bus and/or if an unexpected message appears on the output bus or on any other bus monitored by traffic predictor 120.

The counts of test passes and test fails may then be published on a graphical user interface (GUI) of test controller 104. In embodiments, traffic predictor 120 may categorize test passes and test fails into different types, such as test passes and fails for pass-through message, test passes and fails for particular types of communication buses, etc. In such embodiments, the test passes and fails may be published in different categories that reflect the different types of test passes and fails.

Figure 2:
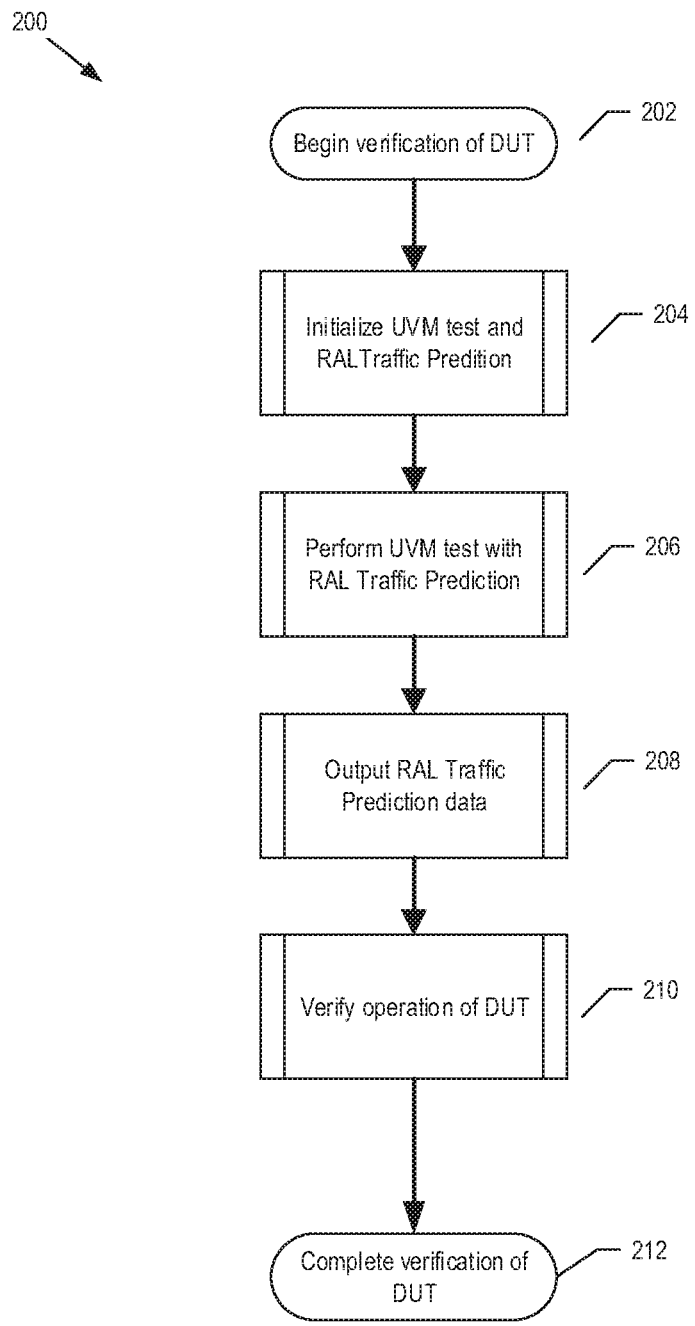
FIG. 2 is a flow diagram showing an illustrative process for verifying an IC design in accordance with described embodiments.

FIG. 2 shows a flow diagram of an illustrative process to verify a DUT, shown as verification process 200. At block 202, process 200 begins. At block 204, the UVM testbench (e.g., testbench 100 of FIG. 1) and the RAL Traffic Predictor (e.g., traffic predictor 120 of FIG. 1) are initialized. At block 206, testbench 100 performs the UVM test with RAL result prediction. At block 208, all UVM Register Predictors output the RAL predicted data, uvm_reg_item, (e.g., UVM Register Predictor 114 and 124 of FIG. 1). At block 210, the design of DUT 108 is verified and/or debugged, for example based upon the output RAL predicted data, uvm_reg_item. At block 214, verification process 200 completes.

Figure 3:
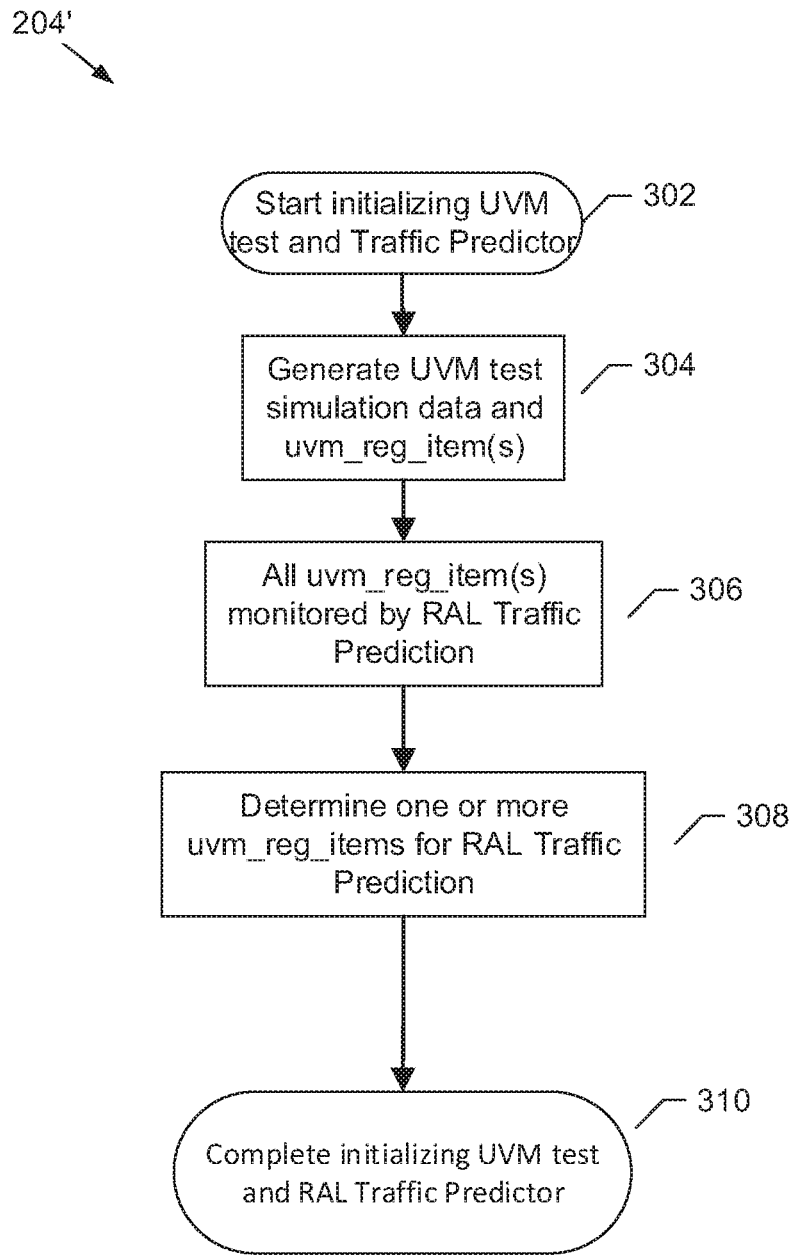
FIG. 3 is a flow diagram showing an illustrative process for initializing the IC verification process of FIG. 2 in accordance with described embodiments.

FIG. 3 shows additional detail of UVM initialization block 204 of FIG. 2, shown as process 204'. At block 302, process 204' begins. At block 304, UVM test simulation data may be generated and stored, for example, as protocol-agnostic UVM stimulus data in UVM register layer 110 of FIG. 1. Further, one or more uvm_reg_items may be generated that provide either a random or structured sequence of stimulus data to verify DUT 108. The UVM test simulation data and transaction streams may be generated based upon one or more test conditions, sample data, and configuration options provided by test controller 104 (e.g., provided by a user of testbench 100).

At block 306, one or more uvm_reg_items may be provided to traffic predictor 120. At block 308, traffic predictor 120 may determine one or more items be processed to predict and verify the DUT 108's operations. At block 310, process 204' completes.

Figure 4:
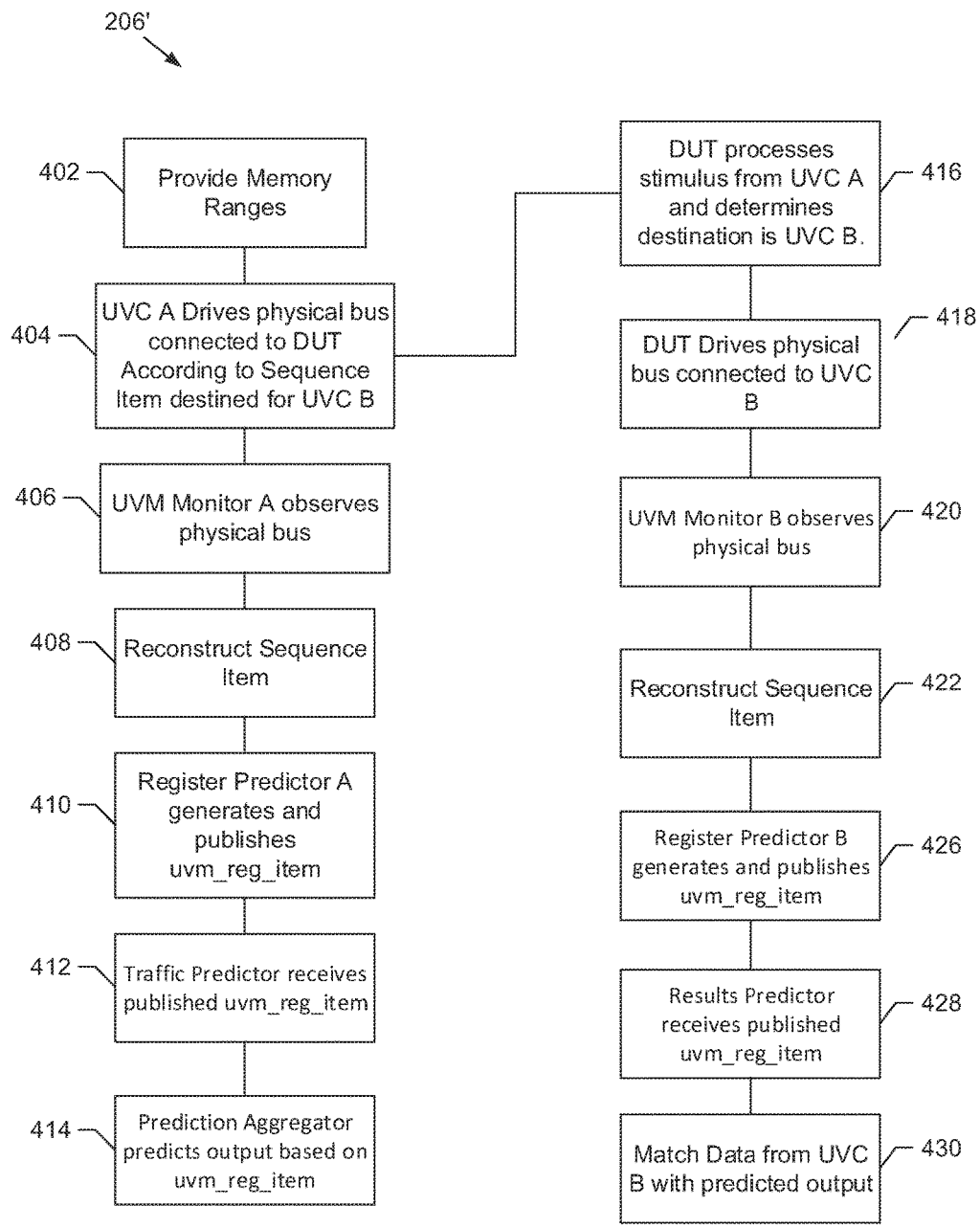
FIG. 4 is a flow diagram showing an illustrative process for predicting and aggregating a register abstraction layer (RAL) of the verification process of FIG. 2 in accordance with described embodiments.

FIG. 4 shows additional detail for UVM test and RAL traffic prediction block 206 of FIG. 2, shown as process 206'. Referring also to FIG. 1, at block 402, a user may provide emulator 102 with all memory ranges associated with any or all UVCs. For instance, in the example shown in FIG. 1, memory ranges associated with UVC 106 and 122 may be provided to emulator 102 and traffic predictor 120. In box 404, a first UVC A (for instance, UVC 106 in FIG. 1) may drive a protocol specific sequence item onto bus 126 to be received by DUT 108. The protocol specific sequence item may comprise bus traffic having a specific protocol associated with bus 126.

In block 406, UVM Monitor (for instance monitor 118 in FIG. 1) may observe the traffic on bus 126 and, in box 408, may reconstruct a sequence item from the traffic on bus 126. Reconstructing the sequence item may include predicting a change in a register value of DUT 108 based on the sequence item. For example, if the sequence item is a PCIe bus message, UVM register predictor 114 may predict which PCIe registers of DUT 108 will be affected by the message and what their values will be.

In box 410, UVM register predictor (for instance 114 in FIG. 1) generates and publishes the predicted uvm_reg_item (e.g. the predicted register/memory changes which affect the DUT 108), which is received by traffic predictor 120 in box 412. In box 414, traffic predictor 120 may then predict the output of DUT 108 based on the uvm_reg_item.

In box 416, the stimulus sent to the DUT 108 from UVC A (e.g. UVC 106 in FIG. 1), performed during process box 404, is processed by the DUT 108. In box 481, The DUT 108 may forward the stimulus to UVC B (e.g. UVC 122 in FIG. 1) which may drive bus 128 in FIG. 1. The forward operation may transform the stimulus to a different protocol format if UVC A is a different protocol than UVC B (e.g UVC A is PCIe and UVC B is USB). In addition, the DUT 108 may perform arbitration logic on stimulus received from UVC A 106 prior to transmitting the stimulus to UVC B 122.

UVM monitor 118 may observe and monitor the traffic on bus 128 in box 420 and reconstruct UVC B's protocol specific sequence item from the traffic on bus 128 in box 422. The aforementioned operation may behave the same way when reversed (eg UVC B sends the DUT stimulus destined for UVC A). In addition, the traffic predictor 120 in FIG. 1 may automatically scale to support any number of UVCs connected to the DUT. For example, suppose the testbench 100 in FIG. 1 comprised of four UVCs (UVC A, UVC B, UVC C, UVC D). The traffic predictor 120 may automatically manage the prediction and scoring of all 12 unique relationships (e.g, A→{B,C,D}, B→{A,C,D}, C→{A,B,D, and D→{A,B,C}). The complexity factor is N*(N−1), where N is the number of UVCs.

In box 426, register predictor 124 may generate and publish a predicted uvm_reg_item based on the sequence item. Generating the uvm_reg_item may include predicting a change in register value in a memory location of UVC B 122. In some embodiments, generating the uvm_reg_item may include predicting an output of DUT 108.

In box 428, traffic predictor 120 receives the predicted uvm_reg_item and, in box 430, matches data from the second UVM Register Predictor 124 with the predicted uvm_reg_item from UVM Register Predictor 114. If the data match, then traffic predictor 120 scoring may indicate a test pass. If the data do not match, then traffic predictor may indicate a test fail. The pass and fail results may be published and/or displayed, as described above.

Figure 5:
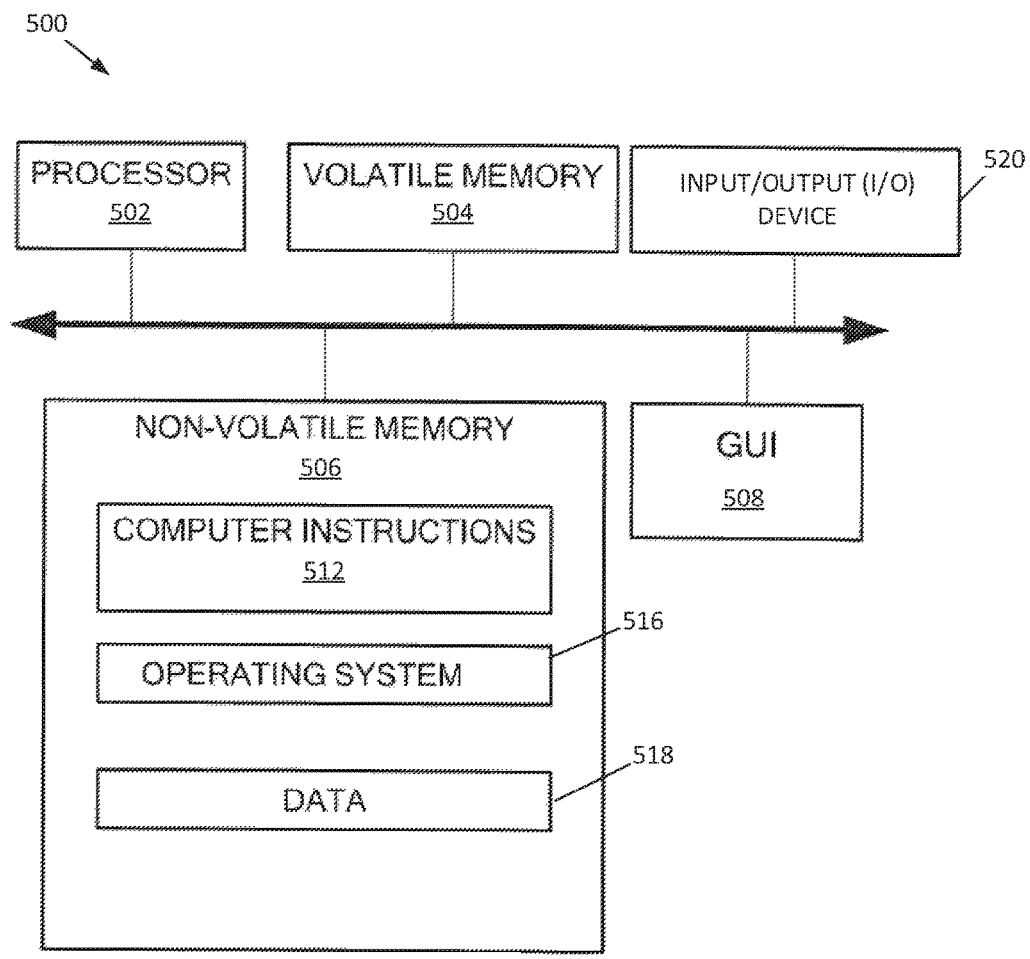
FIG. 5 is a block diagram showing a hardware architecture of an illustrative test controller of the system of FIG. 1 in accordance with described embodiments.

Referring to FIG. 5, in some embodiments, test controller 104 of FIG. 1 may be implemented as, or by, one or more computers or coupled to one or more computers, such as computer 500. Computer 500 may include processor 502, volatile memory 504 (e.g., RAM), non-volatile memory 506 (e.g., a hard disk drive, a solid-state drive such as a flash drive, a hybrid magnetic and solid state drive, etc.), graphical user interface (GUI) 508 (e.g., a display or touchscreen, etc.) and input/output (I/O) device 520 (e.g., a mouse, a keyboard, a touchscreen, and so forth). Non-volatile memory 506 stores computer instructions 512, an operating system 516 and data 518 such that, for example, the computer instructions 512 are executed by the processor 502 out of volatile memory 504 to perform at least a portion of the processes describe above. For example, computer instructions 512, when executed by processor 502, may cause computer 500 to perform process 200, process 204', process 206', and/or other processes related to processes 200, 204', or 206'. Program code may be applied to data entered using an input device of GUI 508 or received from I/O device 520.

The processes described herein are not limited to use with the hardware and software of FIG. 5 and may find applicability in any computing or processing environment and with any type of machine or set of machines that can run a computer program. The processes described herein may be implemented in hardware, software, or a combination of the two.

The processes described herein are not limited to the specific embodiments described. For example, processes 200, 204', and 206' are not limited to the specific processing order shown in FIGS. 2, 3, and 4. Rather, any of the blocks may be re-ordered, combined or removed, or performed in parallel or in serial, as necessary, to achieve the results set forth herein.

Processor 502 may be implemented by one or more programmable processors executing one or more computer programs to perform the functions of the system. As used herein, the term "processor" describes an electronic circuit that performs a function, an operation, or a sequence of operations. The function, operation, or sequence of operations may be hard coded into the electronic circuit or soft coded by way of instructions held in a memory device. A "processor" may perform the function, operation, or sequence of operations using digital values or using analog signals. In some embodiments, the "processor" can be embodied in processing devices including, for example, a general purpose microprocessor, a digital signal processor (DSP), a reduced instruction set computer (RISC), a complex instruction set computer (CISC), an application specific integrated circuit (ASIC), a field programmable gate array (FPGA), a system on chip (SOC), a programmable logic array (PLA), a microcontroller, an embedded controller, a multi-core processor, and/or others, including combinations of the above. In some embodiments, the "processor" may be embodied in a microprocessor with associated program memory. In some embodiments, the "processor" may be embodied in a discrete electronic circuit. The "processor" may be analog, digital or mixed-signal. In some embodiments, the "processor" may be one or more physical processors or one or more "virtual" (e.g., remotely located or "cloud") processors.

When implemented on a processing device, the program code segments combine with the processor to provide a unique device that operates analogously to specific logic circuits. Described embodiments may be implemented as an electronic circuit, an integrated circuit, a multi-chip module, a single card, or a multi-card circuit pack. Further, as would be apparent to one skilled in the art, various functions of circuit elements may also be implemented as processing blocks in a software program. Such software may be employed in, for example, a digital signal processor, microcontroller, or general purpose computer. Thus, described embodiments may be implemented in hardware, a combination of hardware and software, software, or software in execution by one or more processors.

Some embodiments may be implemented in the form of methods and apparatuses for practicing those methods. Described embodiments may also be implemented in the form of program code, for example, stored in a storage medium, loaded into and/or executed by a machine, or transmitted over some transmission medium or carrier, such as over electrical wiring or cabling, through fiber optics, or via electromagnetic radiation. Described embodiments may also be implemented in the form of a bitstream or other sequence of signal values electrically or optically transmitted through a medium, and/or stored magnetic-field variations in a magnetic recording medium that may be generated using a method and/or an apparatus as described herein. A non-transitory machine-readable medium may include one or more tangible storage media and/or one or more "virtual" (e.g., remotely located or "cloud") storage media. A non-transitory machine-readable medium may include storage devices such as magnetic recording media including hard drives, floppy diskettes, and magnetic tape media, optical recording media including compact discs (CDs) and digital versatile discs (DVDs), solid state memory such as flash memory, hybrid magnetic and solid state memory, non-volatile memory, volatile memory, and so forth, but does not include a transitory signal per se. When embodied in a non-transitory machine-readable medium, and the program code is loaded into and executed by a machine, such as a computer, the machine becomes an apparatus for practicing the method.

Various elements, which are described in the context of a single embodiment, may also be provided separately or in any suitable sub-combination. It will be further understood that various changes in the details, materials, and arrangements of the parts that have been described and illustrated herein may be made by those skilled in the art without departing from the scope of the following claims.

The invention claimed is:

1. A system for verifying functionality of a circuit design under test (DUT), the system comprising:
   a control station comprising at least one graphical user interface (GUI);
   at least one emulator in communication with the control station, the emulator comprising a verification component and a register abstraction layer (RAL), wherein the verification component is configured to implement the DUT and wherein the RAL is configured to implement one or more communication interfaces of the DUT, wherein the at least one emulator is configured to:
   generate stimulus for a communication interface of the DUT, the stimulus comprising one or more transactions, the transactions associated with commands of the communication interface and test data associated with the commands;
   send the stimulus to the DUT via the communication interface; and
   monitor one or more associated responses sent from the DUT via the communication interface; and a traffic predictor in communication with the at least one emulator and the control station, the traffic predictor configured to:
   monitor data traffic over the communication interface between the at least one emulator and the DUT;
   predict a response to the data traffic by the DUT;
   monitor a response to the traffic by the DUT; and
   determine if the response by the DUT matches the predicted response,
   wherein the traffic predictor is configured to count a first number of responses by the DUT that match the predicted responses and a second number of responses by the DUT that do not match the predicted responses.

2. The system of claim 1, wherein the emulator is further configured to:
   generate one or more protocol-specific sequence items for each transaction, protocol-specific sequence items specific to a protocol of the communication interface; and
   convert the one or more protocol-specific sequence items into one or more associated protocol-agnostic register abstraction layer (RAL) uvm_reg_items.

3. The system of claim 2, wherein the emulator is further configured to:
   generate, based upon the stimulus, one or more protocol-specific response sequence items; and
   convert the one or more protocol-specific response sequence items into one or more associated protocol-agnostic register abstraction layer (RAL) uvm_reg_items.

4. The system of claim 3, wherein the traffic predictor is configured to decode the protocol-agnostic RAL uvm_reg_items into source commands and test data.

5. The system of claim 1, wherein the traffic predictor is configured to display the first number as a number of tests passed and the second number as a number of tests failed.

6. The system of claim 1, wherein the traffic predictor determines whether a response by the DUT matches the predicted response by monitoring a register and/or by monitoring data traffic generated by the DUT.

7. The system of claim 1, wherein the traffic predictor is further configured to determine if the data traffic includes a route-through message to be routed through the DUT.

8. The system of claim 7, wherein the traffic predictor is configured to determine if the response by the DUT includes the route-through message.

9. The system of claim 7, wherein the traffic predictor is configured to determine if the response by the DUT includes messages initiated exclusively by the DUT.

10. A computer-implemented method for verifying functionality of a circuit design under test (DUT), the method comprising:
   generating a stimulus for a communication interface of the DUT, the stimulus comprising one or more transactions, the transactions associated with commands of the communication interface and test data associated with the commands;
   sending the stimulus to the DUT via the communication interface and monitoring one or more associated responses sent from the DUT via the communication interface;
   predicting a response by the DUT to the one or more transactions;
   monitoring the response by the DUT to the one or more transactions; and
   determining if the response by the DUT matches the predicted response; wherein generating the stimulus further comprises:
   generating one or more protocol-specific sequence items for each transaction, protocol-specific sequence items specific to a protocol of the communication interface; and
   converting the one or more protocol-specific sequence items into one or more associated protocol-agnostic register abstraction layer (RAL) uvm_reg_items.

11. The method of claim 10, wherein monitoring the one or more associated responses further comprises:
   generating, based upon the stimulus, one or more protocol-specific response sequence items; and converting the one or more protocol-specific response sequence items into one or more associated protocol-agnostic register abstraction layer (RAL) uvm_reg_items.

12. The method of claim 11, further comprising decoding the protocol-agnostic RAL uvm_reg_items into source commands and test data.

13. The method of claim 12, further comprising counting a first number of responses by the DUT that match the predicted responses and a second number of responses by the DUT that do not match the predicted responses and displaying the first number as a number of tests passed and the second number as a number of tests failed.

14. The method of claim 10, further comprising matching the predicted response by monitoring a register and/or by monitoring data traffic generated by the DUT and comparing the register and/or data traffic to the predicted response and determining if the response by the DUT includes the route-through message.

15. The system of claim 7, wherein the traffic predictor is configured to determine if the response by the DUT includes messages initiated exclusively by the DUT.

16. A system for verifying functionality of a circuit design under test (DUT), the system comprising:
a control station comprising at least one graphical user interface (GUI);
a first UVM verification component (UVC) in communication with the control station and the DUT, wherein the first UVC is configured to communicate with the DUT over a first communication interface of the DUT; and
a second UVC in communication with the control station and the DUT, wherein the second UVC is configured to communicate with the DUT over a second communication interface of the DUT; and
a traffic predictor in communication with the first and second UVCs, the traffic predictor configured to:
monitor input data traffic to the DUT over the first communication interface;
monitor output traffic from the DUT over the first and/or second communication interface;
compare the output traffic from the DUT to a predicted output of the DUT in response to the data traffic to the DUT; and
determine if the output of the DUT matches the predicted output;
wherein the traffic predictor is further configured to count a test pass if the output of the DUT matches the predicted output and count a test fail if the output of the DUT does not match the predicted output.

17. The system of claim 16, further comprising a GUI configured to display a count of the test passes and a count of the test fails.

* * * * *